United States Patent [19]
Riddell et al.

[11] Patent Number: 5,548,810
[45] Date of Patent: Aug. 20, 1996

[54] HANDS-FREE TWO-WAY RADIO COMMUNICATION SYSTEM

[75] Inventors: Donnie L. Riddell, Winchester; Fred R. Shepherd, Versailles, both of Ky.

[73] Assignee: Safe Pursuit, Inc., Winchester, Ky.

[21] Appl. No.: 221,131

[22] Filed: Mar. 30, 1994

[51] Int. Cl.$^6$ .................................................. H04B 1/34
[52] U.S. Cl. ........................... 455/99; 455/161.1; 455/89
[58] Field of Search ............................... 455/77, 78, 89, 455/90, 99, 95, 117, 161.1, 166.2, 185.1, 186.1; 379/89; 381/168, 169, 55, 123

[56] References Cited

U.S. PATENT DOCUMENTS

| | | |
|---|---|---|
| 2,433,281 | 12/1947 | Lord . |
| 3,371,278 | 2/1968 | Gelushia et al. . |
| 3,532,986 | 10/1970 | Gelushia et al. . |
| 3,544,720 | 12/1970 | Corderman ................................ 381/55 |
| 3,611,140 | 10/1971 | Shimada . |
| 3,644,883 | 2/1972 | Borman et al. . |
| 3,906,472 | 9/1975 | Guadara et al. . |
| 4,151,468 | 4/1979 | Kerr . |
| 4,287,599 | 9/1981 | Goncharoff et al. ...................... 455/77 |
| 4,325,143 | 4/1982 | Kerr . |
| 4,903,325 | 2/1990 | Yoshitake et al. . |
| 4,905,270 | 2/1990 | Ono ............................................ 455/90 |
| 4,922,547 | 5/1990 | Murata .................................... 381/168 |
| 5,128,982 | 7/1992 | Dugdale et al. ........................... 379/89 |
| 5,247,703 | 9/1993 | Englert . |

FOREIGN PATENT DOCUMENTS 4068949 4/1992 Japan .

*Primary Examiner*—Andrew Faile
*Attorney, Agent, or Firm*—King & Schickli

[57] ABSTRACT

The hands-free, two-way communication radio includes a multiple channel transmitter/receiver having one of the channels designated a primary communication channel. The transmitter/receiver is also operable in a scan mode to scan multiple channels for communication signals. The radio also includes an interface operatively connected to the multiple channel transmitter/receiver and a hands-free microphone operatively connected to the transmitter/receiver through the interface. A foot pedal actuator is provided for keying the hands-free microphone to allow transmission of a message over the multiple channel transmitter/receiver. Further, the radio includes a switching mechanism operative in response to actuation of the foot pedal for providing a control signal to the multiple channel transmitter/receiver. This control signal results in the multiple channel transmitter/receiver switching to the primary communication channel for transmission of the message. The invention also includes the combination of the interface, hands-free microphone and foot pedal actuator and switching system for retrofit conversion of a standard radio to hands-free operation.

21 Claims, 2 Drawing Sheets

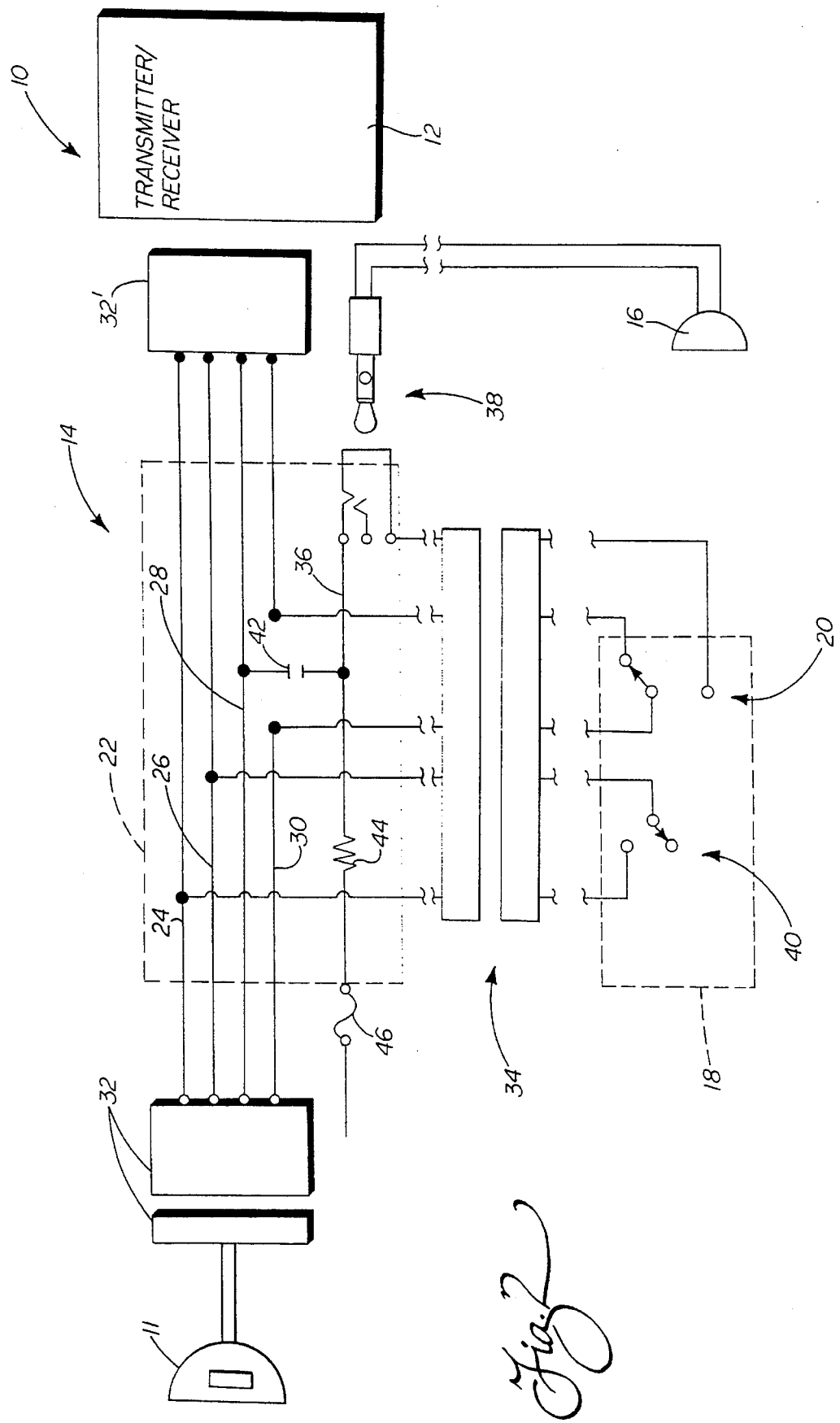

HANDS-FREE TWO-WAY RADIO COMMUNICATION SYSTEM

TECHNICAL FIELD

The present invention relates generally to the field of two-way radio communication and, more particularly, to a complete two-way radio with hands-free communication capability and a retrofit apparatus and interface for converting a two-way radio equipped with a standard microphone with press-to-talk transmission switch to hands-free capability.

BACKGROUND OF THE INVENTION

Two-way communication radios allowing for multiple channel transmission and reception of messages have long been known in the art. As standard equipment such radios incorporate a hand-held microphone having a "press-to-talk" transmission switch that must be manually activated to transmit a message. Such radios also typically include a scanning feature. In the scan mode of operation; the radio scans through all or a programmed group of the multiple channels so as to allow the monitoring of communications taking place. Two-way radios of this type are presently manufactured by a number of companies under brand names including: Motorola, General Electric, Uniden, Kenwood, Regency, Wilson and Bearcat.

A primary market for the sale of two-way communication radios is law enforcement and public safety agencies. Specifically, these agencies install a two-way communications radio in each of their vehicles so that an officer or official in the vehicle may benefit from two-way communication with a dispatcher at a central information processing location.

Many times the operator of the vehicle must communicate with the dispatcher while the vehicle is in motion. Unfortunately, the manipulation necessary to communicate utilizing the standard equipment, hand-held microphone with the manually operated transmission switch may cause the operator to compromise vehicle control. This is particularly true in high speed pursuit situations when the operator must either remove his eyes from the road to visually locate the microphone or blindly feel for the microphone. In either event, the operator must also remove a hand from the steering wheel to grasp the microphone thereby surrendering some control and adversely affecting the directional stability of the vehicle.

Recognizing this shortcoming, several attempts have been made in the past to provide for hands-free operation of the two-way radio in a vehicle. Specifically, the goal of these prior art devices has been to allow the operator to transmit a message over the two-way radio without removing his hands from the steering wheel or his eyes from the road. Examples of such prior art systems are disclosed in U.S. Pat. Nos. 3,906,472 to Guadara et al. and 4,151,468 to Kerr.

In the Guadara et al. patent the radio communication system incorporates a transmitter, a normal press-to-talk microphone, and a hands-free microphone. Foot operated switches allow control of the hands-free microphone.

In Kerr, a standard press-to-talk microphone is positioned in a holder adjacent to the mouth of the driver and an actuating mechanism for the microphone is controlled by a foot pedal.

While each of these approaches do allow for the transmission of messages over the two-way radio without diverting the eyes of the vehicle operator from the road or the hands of the vehicle operator from the steering wheel, these approaches do not allow multiple channel two-way radios to be operated in the "scan mode".

As previously discussed, when in the scan mode, the radio scans through the multiple channels for communication signals. Due to a need to remain informed of events requiring their attention, police officers on patrol in their vehicles regularly monitor communications over a number of channels using this scan feature. Hence, it should be appreciated that the scan feature is an important radio function and any hands-free transmission capability must be compatible with the use of the scan function.

The scan mode functions when that mode is selected for operation and the standard microphone is in its resting or "hooked" position on the side of the radio. Only when the microphone is lifted or "unhooked" from the radio does the radio switch to a primary communication channel for transmission of a message to the dispatcher.

At present, no prior art system for the hands-free operation of a two-way radio known to the inventors will allow the operator to take advantage of the important scanning feature built into present day radios. A need is, therefore, identified for an improved system allowing both hands-free message transmission and scan mode function so that an operator may take the fullest advantage of the available operation features of the radio.

SUMMARY OF THE INVENTION

Accordingly, it is a primary object of the present invention to provide a complete hands-free, two-way radio communication system, as well as an apparatus and interface for the retrofit conversion of a standard two-way radio communication system for hands-free operation, overcoming the above-described limitations and disadvantages of the prior art.

Another object of the present invention is to provide a hands-free, two-way radio communication system that allows operation of the radio in a scan mode so that multiple channels may be scanned for communications while the radio is also advantageously returned to a primary communications channel upon actuation of a hands-free microphone. Accordingly, it should be appreciated that the invention is particularly useful when installed in public safety, fire department and police department vehicles where it allows both normal scan function and hands-free radio transmission. Accordingly, the operator of the vehicle may monitor all the communication channels and transmit messages as needed while maintaining his eyes on the road and his hands on the vehicle controls.

Additional objects, advantages, and other novel features of the invention will be set forth in part in the description that follows and in part will become apparent to those skilled in the art upon examination of the following or may be learned with the practice of the invention. The objects and advantages of the invention may be realized and attained by means of the instrumentalities and combinations particularly pointed out in the appended claims.

To achieve the foregoing and other objects, and in accordance with the purposes of the present invention as described herein, an improved radio is provided allowing hands-free, two-way communication. The radio includes a multiple channel transmitter/receiver. Advantageously, the radio is operable in a scan mode to scan all or a pre-selected number of the multiple channels for communication signals. Additionally, one of the channels is designated a primary communications channel. This channel allows communication with a dispatcher operating a base unit, at a central information processing and control location.

An interface is provided operatively connected to the multiple channel transmitter/receiver. A hands-free microphone is operatively connected to the transmitter/receiver through this interface. Additionally, a foot pedal actuator is provided for keying the hands-free microphone. When keyed, the hands-free microphone allows transmission of a message over the multiple channel transmitter/receiver. More specifically, when the transmitter/receiver is set for a standard mode of operation, the transmission of the message takes place over the specific channel to which the transmitter/receiver is set. When the transmitter/receiver is set for operation in a scan mode, however, the keying of the hands-free microphone causes a means operative in response thereto to provide a control signal to the multiple channel transmitter/receiver. This control signal results in the transmitter/receiver switching to a predesignated primary communication channel for transmission of the message.

Thus, it should be appreciated, that through the utilization of the present invention, the operator of the radio may enjoy a combination of features unattainable with prior art, two-way communication radio designs: that is, a fully operational scanning function and true hands-free transmission ability over a pre-selected primary communication channel. Thus, police department, fire department, and safety personnel all benefit when the radio of the present invention is installed in their vehicle.

Specifically, these individuals may enjoy free communication with the dispatcher without any distraction or interruption to their control of vehicle operation. More specifically, the operator may maintain his eyes fully on the road, his hands continuously on the steering wheel and his right foot fully free to operate the gas and brake pedals. Thus, one hundred percent vehicle control is maintained even during communications. The transmitting and receiving of the radio is fully controlled by the foot pedal actuator that may be mounted on the floor of the vehicle at a convenient location for operation by the otherwise unoccupied left foot of the vehicle operator.

Still more specifically, the foot pedal actuator is preferably a double pole/double throw switch. Further, the radio includes a control signal line and a microphone transmission line. The double pole/double throw switch includes a normally closed circuit in the control signal line and normally open circuit connected into the microphone transmission line leading to the hands-free microphone. In addition, a power input line is provided to the hands-free microphone and a signal input line leads to the transmitter/receiver. A capacitor couples the power input line to the signal input line in order to couple the AC component (signal output) of the microphone amplifier to the signal input terminal of the transmitter/receiver. The signal is utilized to modulate the carrier signal of the transmitter and thereby transmit a message. Additionally, the capacitor isolates any unwanted DC voltage on the transmitter microphone input terminal. Preferably, the capacitor is rated at 0.01 µf, 50 V.

In addition, a resistor is provided in the power input line. This resistor serves as a voltage dropping resistor and is sized according to the input voltage requirements of the particular hands-free microphone being utilized. Further, a fuse is provided in the power input line to provide surge and short circuit protection.

In accordance with a further aspect of the present invention, the radio may also include a second microphone of "standard" design including a press-to-talk transmission switch that is operatively connected to the multiple channel transmitter/receiver through the interface. This microphone also is fully operative in the present system so as to give the vehicle operator the option of this second mode of transmitting a message. This is particularly convenient when the operator wishes to communicate over the radio while standing outside the vehicle, away from the hands-free microphone, and observing some activity.

In accordance with yet another aspect of the present invention an apparatus is provided for retrofitting to a two-way communications radio of standard design incorporating a microphone, including a press-to-talk transmission switch, and providing a scan mode of operation. The apparatus converts that radio to a hands-free operation capability.

As described above, the apparatus includes an interface operatively connected to the multiple channel transmitter/receiver of the radio. Additionally, the apparatus includes a hands-free microphone that is operatively connected to the transmitter/receiver through the interface. Also a foot pedal actuator is provided for keying the hands-free microphone so as to allow transmission of a message over the multiple channel transmitter/receiver.

Further, the apparatus includes a means operative in response to the foot pedal actuator to provide a control signal to the multiple channel transmitter/receiver. This control signal results in the multiple channel transmitter/receiver switching to the primary communication channel for transmission of the message upon keying the hands-free microphone. This is a channel that is predesignated by the operator for this purpose and typically is the channel set up for monitoring by the dispatcher at the centrally located base station.

In accordance with yet another aspect of the present invention, the interface is provided for operatively connecting a hands-free microphone through a foot pedal actuator to a two-way radio including a multiple channel transmitter/receiver and press-to-talk microphone. The interface includes a junction box having a shield line, a microphone transmission line, a signal input line and a control signal line. Additionally, the interface includes a first means of operatively connecting the shield line, microphone transmission line, signal input line, and a control signal line to the transmitter/receiver and, if desired, the standard press-to-talk microphone. A second means is provided for operatively connecting the shield line, microphone transmission line, and the control signal line to the foot actuator.

The interface also includes a power input line and means for operatively connecting the power input line to the hands-free microphone. Thus, an amplified signal is produced so that the hands-free microphone may be located away from the operators face in an out of the way position such as on the dashboard or sun visor so that the hands-free microphone does not interfere with the operation of the vehicle.

As previously described the interface also includes a capacitor for coupling the power input and signal input lines to enable transmission of a message over the transmitter upon keying the hands-free microphone. The interface additionally includes a resistor in the power input line to provide proper input voltage to the hands-free microphone and a fuse in the power input line to provide surge and short circuit protection.

Still other objects of the present invention will become readily apparent to those skilled in this art from the following description wherein there is shown and described a preferred embodiment of this invention, simply by way of illustration of one of the modes best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWING

The accompanying drawing incorporated in and forming a part of the specification, illustrates several aspects of the present invention, and together with the description serves to explain the principles of the invention. In the drawing:

FIG. 2 is a detailed, schematical and partially block diagram representation of the apparatus and interface of the present invention for converting a standard two-way communication radio with press-to-talk microphone to hands-free operation while maintaining the standard scanning function of the multi-channel radio fully operational.

Figure 1:
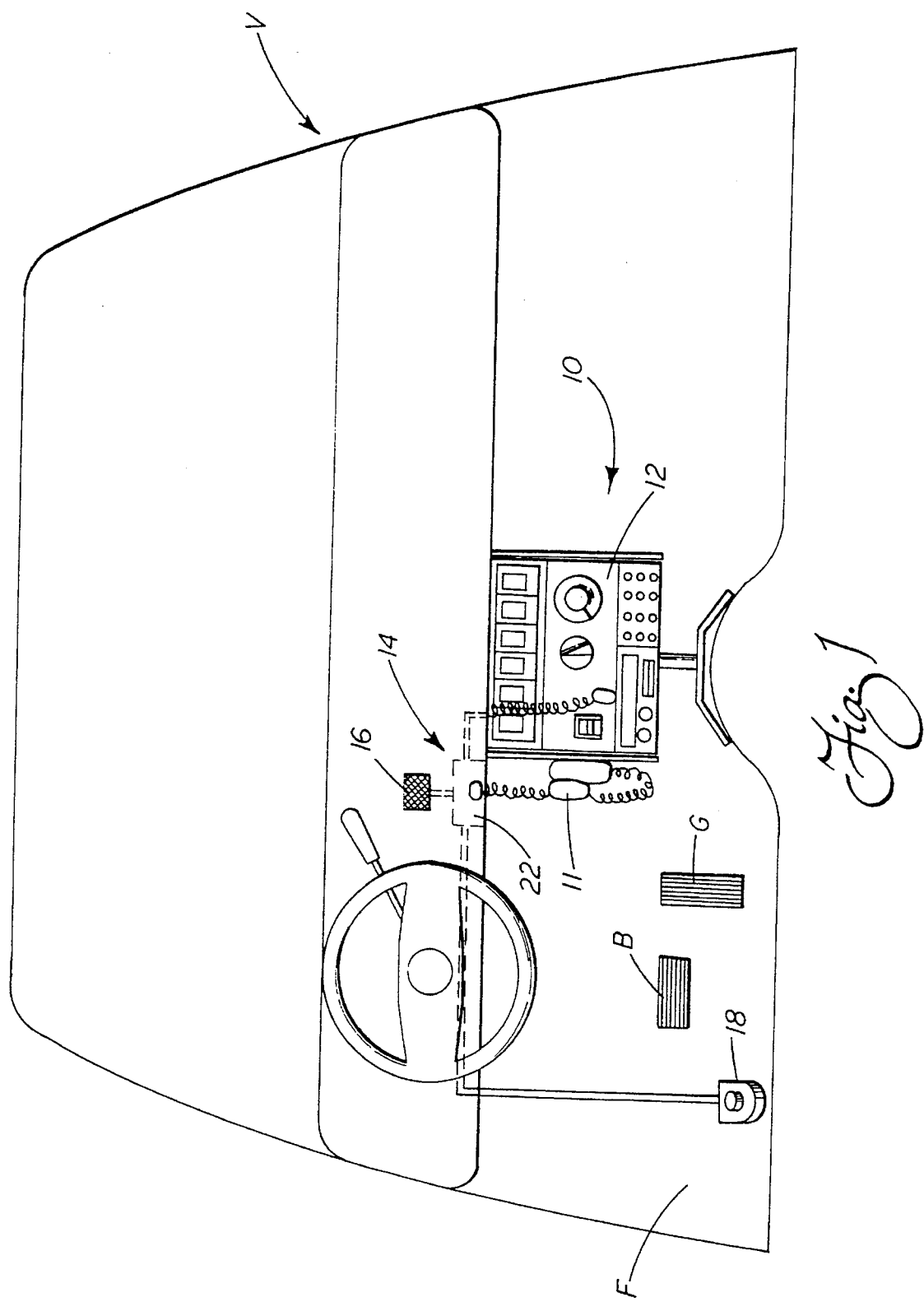
FIG. 1 is a schematical representation of the hands-free, two-way communication radio, retrofit apparatus and interface of the present invention shown installed in a vehicle.

Reference will now be made in detail to the present preferred embodiment of the invention, an example of which is illustrated in the accompanying drawing.

DETAILED DESCRIPTION OF THE INVENTION

Reference is now made to drawing FIG. 1 showing the hands-free, two-way communication radio 10 of the present invention. The radio 10 is being described with reference to mounting in a vehicle such as a police cruiser generally designated by a reference letter V. It should be appreciated, however, that the hands-free, two-way communication radio 10 may be utilized as a mobile unit as described or as a base unit where hands-free operation and transmission of messages would be of benefit.

As shown schematically in FIG. 1, the radio 10 includes a multiple channel transmitter/receiver 12. Such a transmitter/receiver 12 is well known in the art and is marketed under a number of trade names including but not necessarily limited to Motorola, General Electric, Uniden, Kenwood, Regency, Wilson, and Bearcat. The multiple channel transmitter/receiver 12 has one channel that may be selected and designated as a primary communication channel. Further, the transmitter/receiver 12 has circuitry providing for operation in a scan mode and thereby includes a scanning function to allow either a selected number or all of the multiple channels to be scanned for communication signals. This is the mode of operation of the transmitter/receiver 12 generally utilized by police officers while on patrol in their police cruisers.

An interface, generally designated by reference numeral 14, is provided operatively connected to the multiple channel transmitter/receiver 12 (see also FIG. 2). A more detailed description of the interface 14 follows below.

The radio 10 also includes a hands-free microphone 16 that is operatively connected to the multiple channel transmitter/receiver 12 through the interface 14. Preferably, the microphone 16 is amplified so that it may be conveniently positioned in an out of the way location such as on the sun visor or dashboard while still allowing the vehicle operator to transmit a message when speaking in a normal tone of voice.

A foot pedal actuator 18, also operatively connected to the interface 14 allows the hands-free microphone 16 to be keyed for transmission of a message over the multiple channel transmitter/receiver 12. It should be appreciated that, the foot pedal actuator 18 may be positioned on the floor F of the vehicle to the left of the gas and brake pedals G, B, respectively, where the actuator may be conveniently manipulated by the operator of the vehicle utilizing his left foot. This foot is, of course, otherwise unoccupied when driving the vehicle.

As will be described in greater detail below, the radio 10 also includes a means, generally designated by the reference numeral 20, for providing a control signal to the multiple channel transmitter/receiver 12 when the foot pedal actuator 18 is depressed (see FIG. 2). This control signal results in the multiple channel transmitter/receiver 12 switching to the primary communication channel so that the message being transmitted by the operator of the vehicle V through the microphone 16 is received by a dispatcher and others having their receivers set on that communication channel.

As should be appreciated, since the operator of the vehicle V transmits a message over the radio 10 by simply depressing the foot pedal actuator 18 with his left foot and speaking , full and complete control of the vehicle is maintained at all times. More specifically, the operator's hands remain free for operation of the steering wheel. Similarly, as the foot pedal actuator 18 is positioned in a convenient location for engagement with the left foot, the eyes of the operator also remain free to be focused upon the roadway so as to allow maximum vehicle control even while transmitting a message. This is a particularly important aspect and advantage to the present invention when one considers the potential for the vehicle operator to be involved in a high speed pursuit.

Further, as an additional advantage, it should be appreciated that the present invention allows hands-free operation while still allowing full function of the standard scanning mode feature of the transmitter/receiver 12. In contrast, prior art hands-free transmission systems and retrofit apparatus have not been compatible with the scan mode or scanning function so important to the vehicle operator in today's multiple channel network structure found in communication systems utilized by, for example, fire, safety and law enforcement personnel.

Reference is now made to FIG. 2 showing the interface 14 of the present invention in greater detail. As shown in FIG. 2, the interface 14 includes a junction box 22. The junction box 22 includes: a shield line 24; a microphone transmission line 26; a signal input line 28, and a control signal line 30. These lines 24, 26, 28, and 30 extend from junction box 22 to a first set of connectors 32, 32' for operatively connecting these lines, respectively, to the standard, press-to-talk transmission microphone 11 supplied as standard equipment with a two-way communication radio and the transmitter/receiver unit 12 of the radio. Pin connectors of a type known in the art, corresponding to the pin connectors utilized by the manufacturer of the press-to-talk microphone 11 and transmitter/receiver unit 12 of the radio 10 may be utilized for this purpose.

For example, an ORA, 5 pin DIN connector (240°) may be utilized to complete the interface connection with radios presently manufactured under the brand names Regency, Uniden and Bearcat. As another example, an RJ11 phone jack may be utilized to complete the interface connection with radios presently manufactured under the brand names Johnson and Kenwood.

The interface 14 also includes a second connector generally designated by reference numeral 34 to operatively connect the shield line 24, microphone transmission line 26 and control signal line 30 to the foot pedal actuator 18. Any type of connector known in the art and suitable for this purpose may be utilized. Further, it should be appreciated that straight wiring without any connector could also be used.

As further shown in FIG. 2, the junction box 22 includes a power input line 36 that is operatively connected by means of a plug connector arrangement, generally designated by reference numeral 38, to the hands-free microphone 16.

As should further be appreciated by reviewing FIG. 2, the foot pedal actuator 18 comprises a double pole/double throw switch. The double pole/double throw switch of the actuator 18 includes a normally closed circuit 20 operatively connected to the control signal line 30 so that the scan function of the radio 10 will operate as desired until the foot pedal actuator is depressed for transmission of a message over the hands-free microphone 16. Additionally, the double pole/double throw switch of the actuator 18 includes a normally open circuit 40 operatively connected between the shield line 24 and microphone transmission line 26 that allows keying of the hands-free microphone 16 when the actuator 18 is depressed.

As also shown in FIG. 2, a capacitor 42 is provided coupling the power input line 36 with the signal input line 28. The capacitor 42 is selected to be compatible with the hands-free microphone 16 and the transmitter/receiver 12. Preferably, a 0.01 µf, 50 V capacitor is utilized. This capacitor 42 functions to couple the AC component or signal output of the amplifier of the hands-free microphone 16 to the signal input line 28 of the transmitter/receiver 12. This signal is utilized to modulate the carrier signal of the transmitter/receiver 12 thereby transmitting a message. Further, this capacitor 42 also isolates any unwanted DC voltage to the transmitter/receiver 12 signal input line 28.

A resistor 44 is provided in the power input line 36 to insure that the proper input voltage is provided to meet the requirements of operation for the hands-free microphone 16 being utilized. Accordingly, the resistor 44 is matched to the system requirements. Further, a fuse 46 may also be provided in the power input line 36 to provide surge and short circuit protection. Again, the fuse 46 is sized as needed to protect the circuity.

In operation, the transmitter/receiver 12 may be operated in the scan mode whereby the multiple channels are scanned and monitored for communication signals. When hands-free transmission of a message is desired, the operator depresses the foot pedal actuator 18 with his left or non-driving foot. At that time the normally closed circuit 20 is opened providing an "off-hook" signal to the transmitter/receiver 12. This is done by producing an open circuit in the ground path. In response, to this off-hook signal, the transmitter/receiver 12 stops the scanning mode of operation and switches to the primary communication channel for which the transmitter/receiver 12 has been previously programmed. This switching occurs whether or not the standard press-to-talk microphone 11 is connected to the interface 14 and/or hooked in the rest position on the side of the radio.

Simultaneously the normally open circuit 40 is closed thereby keying the transmitter of the transmitter/receiver 12. This is done by providing a ground signal over the microphone transmission line 26 thereby causing the transmitter of the transmitter/receiver 12 to provide a carrier signal to the antenna (not shown) of the unit. Further, the normally open, now closed contacts of the circuit 20 provide a ground path to the electronics of the amplified, hands-free microphone 16, switching the microphone amplifier on and making the microphone "hot" for transmission of the message by the transmitter/receiver 12 over the priority communication channel. Advantageously, this is achieved while the vehicle operator retains his eyes exclusively on the roadway and his hands continuously on the steering wheel.

By lifting the left foot and releasing the pressure on the foot pedal actuator 18, the circuits 20 and 40 return to their normally closed and normally open positions respectively. The transmitter/receiver 12 is then returned to the scan mode of operation just as it was before the foot pedal actuator 18 was depressed.

In summary, numerous benefits result from employing the concepts of the invention. A truly hands-free, two-way radio communication system is provided. Accordingly, vehicle operation is not interrupted so that the operator of the vehicle V may maintain increased control. Only the left foot is utilized to operate the radio and allow the operator to transmit a desired message over the primary communication channel that has been previously selected by the operator and programmed into the transmitter/receiver 12. Further, the unique arrangement of the interface 14 and double pole/double throw switch of the foot pedal actuator 18 allows hands-free operation that, for the first time, is fully compatible with the scanning mode or function of state of the art radios. Further, the hands-free microphone 16 may be utilized with the transmitter/receiver 12 whether or not the transmitter/receiver is also operatively connected to the standard press-to-talk microphone 11.

Additionally, it should be appreciated from reviewing the above that the combination of the interface 14, hands-free microphone 16, and foot pedal actuator 18 may be retrofitted to existing radios to convert those existing systems with press-to-talk microphones 11 to hands-free operation. Advantageously, this may be done by following a simple installation procedure and in a cost efficient manner while providing excellent operational reliability.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with breadth to which they are fairly, legally and equitably entitled.

We claim:

1. A radio allowing hands-free, two-way communication, comprising:

a multiple channel transmitter/receiver, having one channel designated a primary communication channel, operable in a scan mode to scan multiple channels for communication signals;

an interface operatively connected to said multiple channel transmitter/receiver;

a hands-free microphone operatively connected to said multiple channel transmitter/receiver through said interface;

a foot pedal actuator for keying said hands-free microphone to allow transmission of a message over said multiple channel transmitter/receiver; and means operative in response to said foot-pedal actuator for providing a control signal to said multiple channel transmitter/receiver resulting in said multiple channel transmitter/receiver switching to said primary communication channel for transmission of the message.

2. The radio as set forth in claim 1, further including a second microphone including a press-to-talk transmission switch operatively connected to said multiple channel transmitter/receiver through said interface.

3. The radio set forth in claim 2, wherein said foot pedal actuator is a double pole/double throw switch.

4. The radio set forth in claim 3, wherein said radio further includes a control signal line and a microphone transmission line, said double pole/double throw switch including a normally closed circuit in said control signal line and a normally open circuit connected to said microphone transmission line leading to said hands-free microphone.

5. The radio set forth in claim 4, further including a power input line to said hands-free microphone, a signal input line to said transmitter/receiver and a capacitor for coupling said power input line and said signal input line.

6. The radio set forth in claim 5, wherein said capacitor is rated at 0.01 μf, 50 V.

7. The radio set forth in claim 5, further including a resistor in said power input line to provide proper input voltage to said hands-free microphone.

8. The radio as set forth in claim 5, further including a fuse in said power input line to provide surge and short circuit protection.

9. An apparatus for providing hands-free operating capability to a two-way radio including a multiple channel transmitter/receiver and press-to-talk microphone and having one channel designated a primary communication channel while also being operable in a scan mode to scan multiple channels for communication signals, said apparatus comprising:

an interface operatively connected to said multiple channel transmitter/receiver;

a hands-free microphone operatively connected to said multiple channel transmitter/receiver through said interface;

a foot pedal actuator for keying said hands-free microphone to allow transmission of a message over said multiple channel transmitter/receiver; and means operative in response to said foot-pedal actuator for providing a control signal to said multiple channel transmitter/receiver resulting in said multiple channel transmitter/receiver switching to said primary communication channel for transmission of said message.

10. The apparatus as set forth in claim 9 wherein said foot pedal actuator is a double pole/double throw switch.

11. The apparatus set forth in claim 10, further including a control signal line and a microphone transmission line said double pole/double throw switch having a normally closed circuit in said control signal line and a normally open circuit connected to said microphone transmission line leading to said hands-free microphone.

12. The apparatus set forth in claim 11, further including a power input line to said hands-free microphone, a signal input line to said transmitter/receiver and a capacitor for coupling said power input line and said signal input line.

13. The apparatus set forth in claim 12, wherein said capacitor is rated at 0.01 μf, 50 V.

14. The apparatus set forth in claim 12, further including a resistor in said power input line to provide proper input voltage to said hands-free microphone.

15. The apparatus as set forth in claim 12, further including a fuse in said power input line to provide surge and short circuit protection.

16. An interface for operatively connecting a hands-free microphone through a foot controlled actuator to a two-way radio including a multiple channel transmitter/receiver and press-to-talk microphone, the radio having one channel designated a primary communication channel while also being operable in a scan mode to scan multiple channels for communication signals, said interface comprising:

a junction box including a shield line, a microphone transmission line, a signal input line and a control signal line;

first means for operatively connecting said shield line, microphone transmission line, signal input line and control signal line to said transmitter/receiver and said press-to-talk microphone; and second means for operatively connecting said shield line, microphone transmission line and control signal line to said foot actuator.

17. The interface as set forth in claim 16, wherein said interface further includes a power input line and means for operatively connecting said power input line to said hands-free microphone.

18. The interface set forth in claim 17, wherein said interface further includes a capacitor for coupling said power input line and said signal input line.

19. The interface set forth in claim 18, wherein said capacitor is rated at 0.01 μf, 50 V.

20. The interface set forth in claim 17, further including a resistor in said power input line to provide proper input voltage to said hands-free microphone.

21. The interface as set forth in claim 17, further including a fuse in said power input line to provide surge and short circuit protection.

* * * * *